United States Patent
Kalish et al.

(10) Patent No.: US 8,030,624 B2
(45) Date of Patent: Oct. 4, 2011

(54) PHOTOLUMINESCENT COATING FOR VEHICLES

(75) Inventors: Irina Kalish, West Bloomfield, MI (US); Steven J. Magryta, Grand Blanc, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 273 days.

(21) Appl. No.: 12/397,177

(22) Filed: Mar. 3, 2009

(65) Prior Publication Data

US 2010/0224799 A1    Sep. 9, 2010

(51) Int. Cl.
*H01J 37/30* (2006.01)
(52) U.S. Cl. ............ 250/492.2; 250/491; 313/499
(58) Field of Classification Search ........ 250/492.2
See application file for complete search history.

(56) References Cited

U.S. PATENT DOCUMENTS

| | | | | |
|---|---|---|---|---|
| 4,195,245 A * | 3/1980 | Miyazawa | ............ | 313/113 |
| 5,458,927 A * | 10/1995 | Malaczynski et al. | ........ | 427/527 |
| 6,319,426 B1 * | 11/2001 | Bawendi et al. | ....... | 252/301.4 R |
| 7,553,371 B2 * | 6/2009 | Dubrow et al. | ............ | 117/90 |
| 2004/0245912 A1 * | 12/2004 | Thurk et al. | ............ | 313/484 |
| 2006/0240218 A1 * | 10/2006 | Parce | ............... | 428/98 |
| 2008/0191604 A1 * | 8/2008 | Morris et al. | ............ | 313/499 |

* cited by examiner

*Primary Examiner* — Phillip A Johnston

(57) ABSTRACT

The present invention provides a method and composition for illuminating a contoured surface, such as a vehicle having a receiving surface extending from a structural member. A method includes providing a heterogeneous mixture including a semiconductor nanocrystal complex and a dispersion media, with the complex generally including a middle layer extending between a core and an outer layer. The mixture may be applied to receiving surface which receives illumination having sufficient characteristics for illuminating the contoured surface, and added during the polymer processing. In addition, a vehicle illumination composition is provided in which a heterogeneous mixture of a semiconductor nanocrystal complex is immersed within a dispersion media, wherein the complex may further include a semiconductor nanocrystal core separated from an outer layer by a middle layer, and the heterogeneous mixture illuminates the contoured surface.

10 Claims, 1 Drawing Sheet

U.S. Patent        Oct. 4, 2011        US 8,030,624 B2
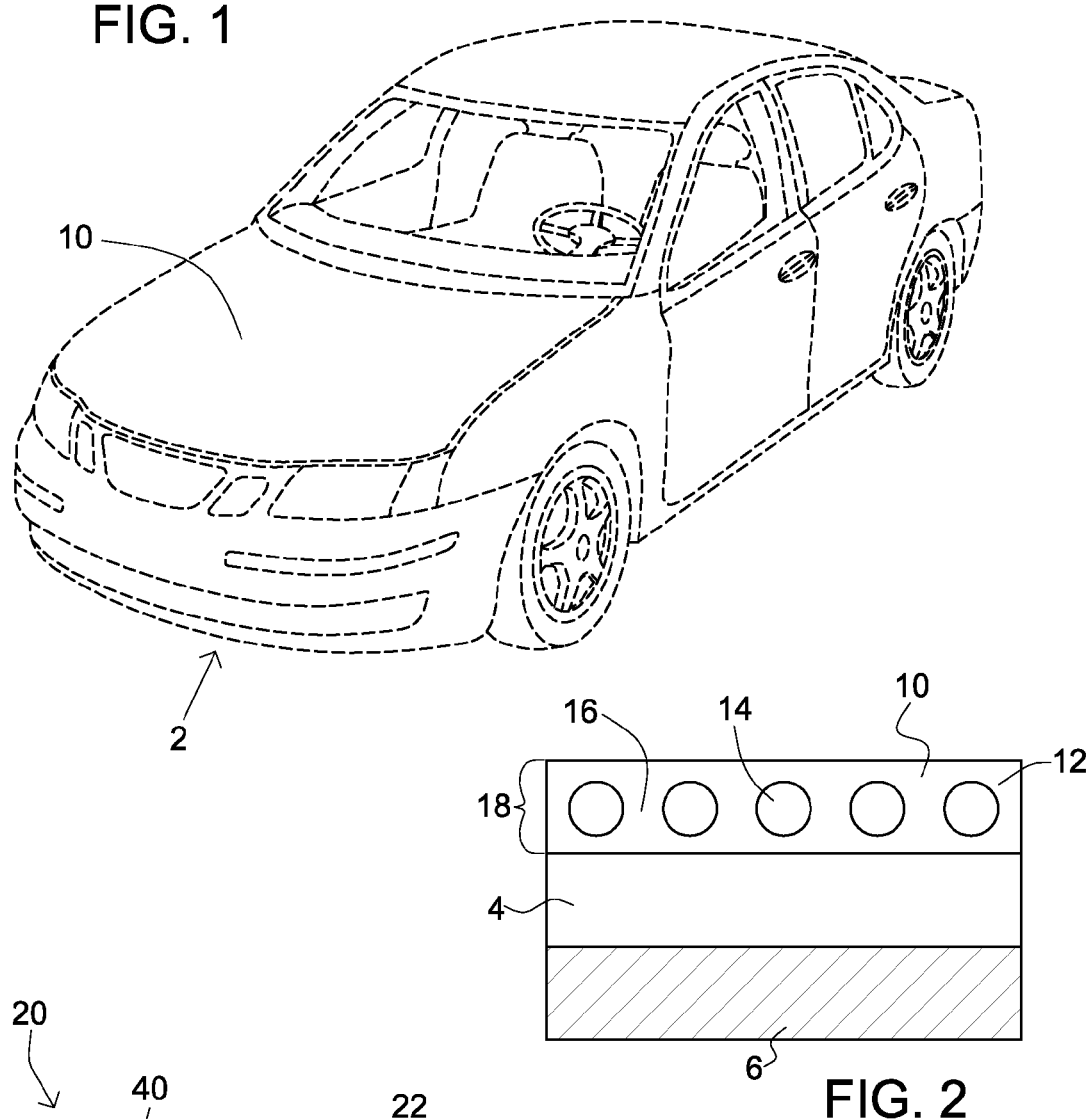
FIG. 1
FIG. 2
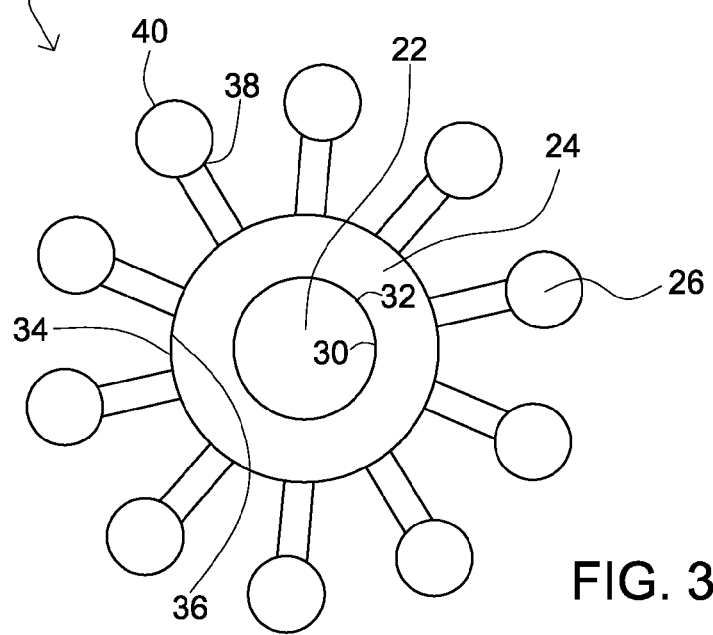
FIG. 3

PHOTOLUMINESCENT COATING FOR VEHICLES

FIELD OF THE INVENTION

This invention relates to coating of vehicles. More specifically, the present invention relates to an illuminating semiconductor nanocrystal coating for vehicles.

BACKGROUND OF THE INVENTION

At night, in low light conditions, it is often difficult to visualize approaching vehicles with limited ambient light associated with the approaching vehicle. In addition, some vehicles are not illuminated because they are parked with their lights turned off. One attempt to address these difficulties is with installing reflective lenses in the approaching vehicle, which, at least in part, reflect some of the light back towards the traveling vehicle, allowing the traveling vehicle to at least partially visualize the approaching vehicle. Other attempts include illuminating kits which require electrical circuitry to increase the visibility of approaching cars. Some of these attempts are utilized during the vehicle manufacturing process and some are after market items installed on the vehicle after the manufacturing process has been completed. Present limitations are addressed by the current invention, which is directed to a vehicle illumination layer.

Several automotive pigments including effect pigments, gloss or lustrous pigments are used to produce unique coloristic effects. Generally, these effect pigments have limited effect as they are generally governed by the optical properties related to reflection and/or interference phenomenon. Generally, finishes containing a visual effect pigment produce a "flop effect" whereby the coloristic characteristics of the surface change depending on the viewing angle. In general, when a change in the viewing angle results in a change in lightness, the effect is referred to as lightness flop, and when the changes are in hue, the effect is referred to as color flop. However, these effects are limited to situations with sufficient available ambient light to produce the coloristic effect and are only modified based upon a change in viewing angle. In situations with a constant viewing angle or with limited ambient light, these effects are not as visually noticeable. In addition, a change in color does not necessarily provide illumination for the associated vehicle. Therefore, there is a need to provide a special visual layer which provides an illumination effect in low light situations.

The present invention relates to the surprising discovery that by applying a semiconductor nanocrystal complex, stably coupled to tertiary molecules, an emission of light of a desired frequency is provided which allows for higher visibility of coated surfaces during low light level situations.

SUMMARY OF THE INVENTION

The present invention reduces the difficulties and disadvantages of the prior art by providing a method and composition for illuminating a contoured surface having a receiving surface extending from a structural member, the method comprising the steps of providing a heterogeneous mixture including a semiconductor nanocrystal complex and a dispersion media, said semiconductor nanocrystal complex including a core, a middle layer and an outer layer, said middle layer extending therebetween, applying the heterogeneous mixture to the receiving surface and illuminating the heterogeneous mixture with an illumination source sufficient to cause said contoured surface to luminesce. The present invention also contemplates a vehicle illumination composition comprising a heterogeneous mixture having a semiconductor nanocrystal complex immersed within a dispersion media, said semiconductor nanocrystal complex further including a semiconductor nanocrystal core separated from an outer layer by a middle layer, said middle layer extending therebetween, whereby said heterogeneous mixture causes a contoured surface to luminesce.

BRIEF DESCRIPTION OF THE DRAWINGS

FIG. 1 is a semi-schematic perspective view illustrating an automobile body.

FIG. 2 is a cross-section of a paint coat of an object.

FIG. 3 is a schematic illustration of a semiconductor nanocrystal complex.

DETAILED DESCRIPTION OF THE INVENTION

As required, detailed embodiments of the present invention are disclosed herein; however, it is to be understood that the disclosed embodiments are merely exemplary of the invention, which may be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure.

In general, the present invention relates to a heterogeneous mixture of a semiconductor nanocrystal complex and a dispersion media applied to the surface of an object, the mixture being excitable by a selected illumination source. FIG. 1 illustrates an embodiment of the method and composition in which an illuminating heterogeneous mixture (generally referred to by the reference numeral 10) is applied to a three dimensionally contoured object 2 having a receiving surface 4 positioned adjacent to a structural member 6 associated with the contoured object 2, such as an automotive body. Upon receipt of an illumination source, such as but not exclusively limited to, a vehicle headlight, the contoured object 2 is adapted for selective illumination. In carrying out the invention, the heterogeneous mixture 10 may be applied to the contoured object 2 as a liquid, a solid or an aerosol.

Upon receipt of the illumination source, the contoured object illuminates as the photons from the illuminating source energize the semiconductor nanocrystal complex, allowing the structural members 6 associated with the received heterogeneous mixture 10 to become visible. Depending on the application of the heterogeneous mixture 10, the entire contoured object 2 may illuminate, portions of the contoured object 2 may illuminate or different portions may have different illumination characteristics for enhanced visibility of the contoured object 2.

A cross-section of the heterogeneous mixture 10 associated with the three dimensional contoured object 2 is illustrated in FIG. 2. Although illustrated as three regions, the structural member 6, an intermediary or receiving surface 4 and an overlying surface 12, the cross-section may vary depending on the number of intermediary layers 4. Generally, the receiving surface 4 is adapted to receive the overlying surface 12. Alternatively, the overlying surface 12, which generally represents the heterogeneous mixture 10, may be applied as plural adjacent layers adapted for illuminating the three dimensional contoured object 2.

Generally, the semiconductor nanocrystal complex 20 of the present invention is illustrated in FIG. 3 and includes a semiconductor nanocrystal core 22, a middle layer 24 and a outer layer 26. As illustrated, the semiconductor nanocrystal core 22 is generally coated by the middle layer 24. At the surface of the semiconductor nanocrystal core 22, surface defects can result in traps for electron or holes that degrade the electrical and optical properties of the semiconductor nanocrystal. The surface of the middle layer 24, associated with the semiconductor nanocrystal core 22, provides an abrupt jump in electron energy potential which helps contain the electrons and holes. This results in greater luminescent efficiency.

Generally, the middle layer 24 provides a covering having semiconductors with a higher band gap energy than the semiconductor nanocrystal core 22. In addition, the middle layer 24 may provide a good conduction and valence band offset with respect to the semiconductor nanocrystal core 22. The conduction band of the middle layer 24 is desirably higher and the valance band is desirably lower than those of the semiconductor nanocrystal core 22. Thus, the band gap energy of the middle layer 24 is generally higher than that of the semiconductor nanocrystal core 22.

The heterogeneous mixture 10, as shown in FIG. 2, includes plural clusters 14 of semiconductor nanocrystals which range from a few angstroms to a few micrometers in diameter and can become luminescent if subjected to light of a complementary wavelength. The emitted light may depend, at least in part, on the utilized semiconducting material and its parameters, however, it is preferred that the emitted light be within the visible spectrum.

The present invention comprises coating a semiconductor nanocrystal (also known as a "semiconductor nanoparticle" or a "quantum dot") with a layer of a surface molecule, which has an affinity for the surface of the semiconductor nanocrystal and affinity to the disruption media on the other end to be further used in coating, painting of the surfaces three-dimensional contoured object 2 and/or as an additive in manufacturing of the polymeric parts. Generally, semiconductor nanocrystals are spherical nanoscale crystalline materials (although oblate and oblique spheroids can be grown as well as rods and other shapes) having a diameter between 1 nm and 20 nm and typically, but not exclusively, composed of II-IV, III-V and IV-VI binary semiconductors.

In accordance with the present invention, the semiconductor nanocrystal core 22 generally includes a first semiconductor 30 that has a selected composition and diameter that enables light emission at a predetermined wavelength and optionally a second semiconductor 32 that has a lattice constant complementary to the semiconductor nanocrystal core 22. Non-limiting examples of first and second semiconductors 30,32 include ZnS, ZnSe, ZnTe, CdS, CdSe, CdTe, HgS, HgSe, GgTe (II-VI materials); PbS, PbSe, PbTe (IV-VI materials); AlN, AlP, AlAs, AlSb, GaN, GaP, GaAs, GaSb, InN, InP, InAs, InSb (III-V materials).

Generally, the semiconductor nanocrystal complex 20 associated with the semiconductor nanocrystal core 22 may be 12 to 150 Å in diameter, depending on the desired wavelength of the emitted light. However, the deviation in size of the semiconductor nanocrystal complex 20 should be generally around 5% or less to provide the desired size and color dependant properties. As previously described, the middle layer, or shell, 24 generally provides semiconductors of a higher band gap to trap electrons escaping through the surface due to faults on the surface of the core. The middle layer 24 may include up to seven monolayers of various semiconducting materials.

The semiconductor nanocrystal complex 20 may include the middle layer or alternatively, may omit the middle layer. If present, the middle layer may be crystalline with semiconductor properties. The middle layer 24, if present extends between the semiconductor nanocrystal core 22 and the outer layer 26. The outer layer 26 may be a monolayer or may be comprised of molecules that have two or more functional groups or ends. The first functional group 36 may be polar, generally having an affinity for the middle layer or the core. The first functional group 36 generally extends towards and has an affinity for the surface of the semiconductor middle layer 24 or nanocrystal core 22 if the middle layer 24 is absent. The second functional group 38 generally extends towards and has an affinity for a solvent 16 associated with a colloid suspension 18. The molecules comprising outer layer 26 may have an additional optional functional group 40, that may modify the affinity of the nanocrystal complex 20 for solvent 16.

In use, the semiconductor nanocrystal complex 20 is suspended within the heterogeneous mixture 10 or at least adapted for suspension within a heterogeneous mixture 10 for application as a luminescent layer on the three-dimensional contoured object 2. The colloid suspension 18 may depend, in part, on which modifying agent is associated with the heterogeneous mixture 10. Through association with a complementary surfactant, the colloid suspension 18 may have an affinity for a hydrophobic or a hydrophilic solvent.

Generally, the first end 38 may include plural functional groups, one being associated with the semiconductor nanocrystal core 22 or middle layer 24 and the other with the hydrophobic solvent which may include, but is not limited to, thiols, amines, phosphines, phosphine oxides, and any combinations thereof. Non-exclusive examples of molecules comprising outer layer 26 may include trioctyl phospine oxide (TOPO), trioctyl phospine (TOP), tributyl phospine (TBP), dodecyl amine, octadecyl amine, hexadecylamine, steric acid, oleic acid, palmitic acid, lauric acid and any combination thereof. Covering the semiconductor nanocrystal core 22 with the middle layer 24 may be accomplished through pyrolysis or by the addition of organometallic precursors in a chelating ligand solution or by an exchange reaction using the prerequisite salts in a chelating surface solution, such chelating surfaces typically being lipophilic. Generally, the middle layer 24 tends to assemble into a coating around the semiconductor nanocrystal core 22, forming a surface-coated semiconductor nanocrystal. The addition of outer layer 26 enables the nanocrystal complex 20 to be suspended within the hydrophobic solvent.

Alternatively, the outer layer 26 may be coated with a stabilizing agent such as a surfactant or a diblock polymer, to stabilize the surface-coated semiconductor nanocrystal within an aqueous solution. In addition to stabilizing the surface-coated semiconductor nanocrystal, the stabilizing agent may also isolate nearby semiconductor nanocrystal cores 22 from each other by spacing them apart and preventing charge transfer across neighboring spaces.

The outer layer 26 may be associated with the bi-functional agents or other molecules, including a variety of surfactants, and may consist of molecules that have a first outer-end 38 and a second outer-end 40, the first outer-end 38 having an affinity for the semiconductor nanocrystal. When the present invention is immersed within a dispersion media, such as but not limited to paint or some other surface coloring material, the second outer-end 40 may be adapted with an affinity for the dispersion media thereby allowing the heterogeneous mixture 10, including the surface coloring material, to be selectively applied to the contoured object 2.

Generally, the resulting coloristic effect may depend upon the size of the selected semiconductor nanocrystal, which in operation, may be easily adjusted to produce the desired effect. The bi-functional agent associated with the outer layer 26 may be optimized for dispersion within a pigmented substance like automotive paint, however, other uses may be contemplated including for use within cosmetics, inks and plastics and other materials suited for a coloristic effect produced by the illumination of light. Alternatively, plural semiconductor nanocrystal complex mixtures may be selectively applied to the receiving surface, each mixture producing different coloristic effects produced by semiconductor nanocrystal having varying diameters, providing various effects through-out the surface of the contoured object 2.

In operation, the semiconductor nanocrystal complex 20 may be immersed within a dispersion media to form the heterogeneous mixture 10 which is then adapted for application to the contoured object 2, having a three-dimensionally contoured surface such as an automotive body panel which may or may not have an underlying pigmented surface adapted to receive the heterogeneous mixture 10.

While the invention has been described with respect to specific examples including presently preferred modes of carrying out the invention, those skilled in the art will appreciate that there are numerous variations and permutations of the above described methods, compositions and techniques that fall within the spirit and scope of the invention as set forth in the appended claims.

The invention claimed is:

1. A method for illuminating a contoured surface of an automotive body having a receiving surface coated on a structural member, the method including the steps of:
   providing a heterogeneous mixture including a semiconductor nanocrystal complex and a dispersion media, said semiconductor nanocrystal complex including a core, a middle layer and an outer layer, said middle layer extending therebetween;
   applying the heterogeneous mixture to the receiving surface of the automotive body; and
   illuminating the heterogeneous mixture with an illumination source separate from and directing light toward the automotive body sufficient to cause said contoured surface of the automotive body to luminesce.

2. The method of claim 1 wherein the heterogeneous mixture includes a plurality of semiconductor nanocrystal complexes.

3. The method of claim 1 further comprising the step of insulating said core.

4. The method of claim 1 whereby said middle layer has a band gap energy greater than said core.

5. The method of claim 1 further comprising the step of coating said core with said middle layer whereby said coated surface presents surface defects with a plurality of traps.

6. The method of claim 1 whereby said middle layer has a first end extending towards said core and a second end extending towards said outer layer which is assisting the dispersion in the dispersion media.

7. The method of claim 1 further comprising the step of suspending said semiconductor nanocrystal complex within a solvent associated with said heterogeneous mixture.

8. The method of claim 1 further comprising the step of selecting the corresponding semiconductor nanocrystal complex to correspond with a desired effect.

9. A vehicle illumination composition coated on an automotive body comprising:
   a heterogeneous mixture having a semiconductor nanocrystal complex immersed within a dispersion media, the heterogeneous mixture being a coating on a contoured surface of the automotive body;
   said nanocrystal complex further including a semiconductor core separated from an outer layer by a middle layer, said middle layer extending therebetween,
   said semiconductor core having a selected band gap energy;
   said outer layer being comprised of molecules with two or more functional groups with at least one having an affinity for one of said middle layer and said core, and another having at least one functional group have an affinity for the dispersion media;
   said middle layer having a higher band gap energy than that of the core, and
   said outer layer having an affinity for said dispersion media whereby said heterogeneous mixture is configured to illuminate the associated contoured surface of the automotive body when a light source directs light onto the automotive body.

10. The composition of claim 9 wherein said dispersion media is one of said hydrophobic and hydrophilic dispersion media.

* * * * *